Horng

[11] 4,318,751
[45] Mar. 9, 1982

[54] SELF-ALIGNED PROCESS FOR PROVIDING AN IMPROVED HIGH PERFORMANCE BIPOLAR TRANSISTOR

[75] Inventor: Cheng T. Horng, San Jose, Calif.

[73] Assignee: International Business Machines Corporation, Armonk, N.Y.

[21] Appl. No.: 129,928

[22] Filed: Mar. 13, 1980

[51] Int. Cl.³ ............... H01L 21/203; H01L 21/265; H01L 21/31

[52] U.S. Cl. .................. 148/1.5; 29/578; 29/579; 29/580; 148/174; 148/175; 148/187; 148/188; 156/643; 156/644; 156/653; 156/657; 204/192 E; 357/20; 357/50; 357/59

[58] Field of Search .............. 148/1.5, 174, 175, 187, 148/188; 29/578, 579, 580; 204/192 E; 156/643, 644, 653, 657, 659.1, 661.1, 662; 357/20, 50, 59

[56] References Cited

U.S. PATENT DOCUMENTS

| 3,600,651 | 8/1971 | Duncan | 357/59 |
|---|---|---|---|
| 3,648,125 | 3/1972 | Peltzer | 357/50 |
| 3,940,288 | 2/1976 | Takagi et al. | 148/1.5 |
| 3,976,524 | 8/1976 | Feng | 430/317 X |
| 4,060,427 | 11/1977 | Barile et al. | 29/579 X |
| 4,063,992 | 12/1977 | Hosack | 29/580 X |
| 4,103,415 | 8/1978 | Hayes | 29/571 |
| 4,104,086 | 8/1978 | Bondur et al. | 148/1.5 |
| 4,110,125 | 8/1978 | Beyer | 156/653 X |
| 4,139,442 | 2/1979 | Bondur et al. | 204/192 E |
| 4,157,269 | 6/1979 | Ning et al. | 148/1.5 |
| 4,159,915 | 7/1979 | Anantha et al. | 148/187 X |
| 4,160,991 | 7/1979 | Anantha et al. | 357/49 |
| 4,242,791 | 1/1981 | Horng et al. | 29/578 |
| 4,252,582 | 2/1981 | Anantha et al. | 29/578 X |

OTHER PUBLICATIONS

Berger et al., "Double Polysilicon MTL Structure", I.B.M. Tech. Discl. Bull., vol. 22, No. 7, Dec. 1979, pp. 2786-2788.

Yeh, T. H., "Self-Aligned Integrated NPN .... Structures", I.B.M. Tech. Discl. Bull., vol. 22, No. 9, Feb. 1980, pp. 4047-4051.

Pogge, H. B., "Reestablishing Parallelism After RIE Etching", IBM Tech. Discl. Bull., vol. 21, No. 5, Oct. 1978, pp. 1849-1850.

Primary Examiner—L. Dewayne Rutledge
Assistant Examiner—W. G. Saba
Attorney, Agent, or Firm—Wesley DeBruin

[57] ABSTRACT

Disclosed is a self-aligned process for providing an improved high-performance bipolar transistor. The transistor device region is isolated from the other devices on the wafer by a wide deep oxide trench. The deep oxide trench which has nearly vertical sidewalls, extends from the epitaxial silicon surface through the N+ subcollector region into the P− substrate. A shallow oxide trench is used to separate the collector reach through region from the base region. A heavily doped polysilicon layer is used to dope and make contact to the transistor base as well as define the emitter window through which the emitter is doped. In the structure, the separation between the emitter contact and the polysilicon base contact is reduced to a very small value. This is achieved by employing the self-aligned process in accordance with the invention. Metal contact to the polysilicon base contact is done over the deep trench oxide isolation. This allows the transistor base area, and hence the collector base capacitance to be minimized. The shallow emitter and narrow base width of the transistor are formed by ion implantations.

7 Claims, 17 Drawing Figures

SELF-ALIGNED PROCESS FOR PROVIDING AN IMPROVED HIGH PERFORMANCE BIPOLAR TRANSISTOR

FIELD OF THE INVENTION

The invention relates to a self-aligned process for fabricating improved high performance bipolar transistors.

CROSS-REFERENCE TO RELATED U.S. PATENT APPLICATIONS

U.S. patent application, Ser. No. 077,699 entitled "High Performance Bipolar Transistors Fabricated by Post Emitter Base Implantation Process" filed Sept. 21, 1979 by C. T. Horng et al, and granted as U.S. Pat. No. 4,242,791 on Jan. 6, 1981.

U.S. patent application Ser. No. 073,593 entitled "A Planar Deep Oxide Isolation Process" filed Sept. 9, 1979 by R. F. Lever et al, and granted as U.S. Pat. No. 4,222,792 on Sept. 16, 1980.

U.S. patent application Ser. No. 098,588 entitled "A Self-Aligned Micrometer Bipolar Transistor Device and Process" filed Nov. 29, 1979 by C. T. Horng et al.

U.S. patent application Ser. No. 126,611 entitled "Structure and Process for Fabricating An Improved Bipolar Transistor" filed Mar. 30, 1980 by J. R. Cavaliere et al.

U.S. patent application Ser. No. 126,610 entitled "Improved Bipolar Transistor and Process for Fabricating Same", filed Mar. 3, 1980 by C. T. Horng et al.

U.S. patent application Ser. No. 133,155 entitled "A Polysilicon Base Self-Aligned Transistor Process and Structure", filed Mar. 24, 1980 by A. P. Ho et al.

U.S. patent application Ser. No. 146,921 entitled "High Performance PNP and NPN Transistor Structure and Process for Fabricating Same", filed May 5, 1980 by C. T. Horng et al.

U.S. patent application Ser. No. 133,156 entitled "High Performance Transistor with Polysilicon Base Contacts and Method For Making Same" filed Mar. 24, 1980 by C. G. Jambotkar.

U.S. patent application Ser. No. 013,696 entitled "Reactive Ion Etching of Polysilicon against $SiO_2$", filed Feb. 21, 1979 by L. E. Forget et al., granted as U.S. Pat. No. 4,214,946 on July 29, 1980.

U.S. patent application Ser. No. 117,887 entitled "Consumable Amorphous Silicon Emitter Process" filed Feb. 1, 1980 by C. T. Horng et al.

BACKGROUND OF THE INVENTION AND PRIOR ART

Numerous integrated circuit devices, structures and techniques of fabricating same, are known to the prior art. The following prior art patents and summaries are submitted to generally represent the state of the art.

Reference is made to U.S. Pat. No. 3,600,651 entitled "Bipolar and Field Effect Transistor Using Polycrystalline Epitaxial Deposited Silicon" granted Aug. 17, 1971 to D. M. Duncan. The Duncan patent discloses adjacent layers of single crystalline and polycrystalline semiconductor material located upon a semiconductor substrate. The single crystalline layer provides for the active regions of a semiconductor device while the adjacent polycrystalline layers provide for lateral contacts to the active regions.

Reference is made to U.S. Pat. No. 3,648,125 entitled "Method of Fabricating Integrated Circuits with Oxidized Isolation and The Resulting Structure" granted Mar. 7, 1972 to D. L. Peltzer. The Peltzer discloses a thin silicon epitaxial layer, formed on a silicon substrate, subdivided into electrically isolated pockets by a grid of oxidized regions of epitaxial silicon material which extend through the epitaxial layer to a laterally extending PN junction.

Reference is made to U.S. Pat. No. 4,103,415 entitled "Insulated-Gate-Field-Effect Transistor with Self-Aligned Contact Hole to Source or Drain" granted Aug. 1, 1978 to J. A. Hayes. The Hayes patent discloses an oxide dielectric layer interposed between the polysilicon gate and the contact hole to the source or drain of an insulated-gate-field-effect transistor to prevent electrical shorts between the gate and metal contact to the source or drain. The oxide dielectric layer enables the contact hole to be extremely close to the polysilicon gate without electrical shorts occurring therebetween, thereby eliminating the need for a minimum separation between the gate and contact hole.

Reference is made to U.S. Pat. No. 4,157,269 entitled "Utilizing Polysilicon Diffusion Sources and Special Masking Techniques" granted June 5, 1979 to T. H. Ning et al. The Ning et al patent discloses a method consisting of a sequence of process steps for fabricating a bipolar transistor having base contacts formed of polysilicon material and an emitter contact formed of polysilicon material or metal. The emitter contact is self-aligned to the base contacts by the use of process steps wherein a single mask aperture is used for defining the base contacts and the emitter.

Reference is made to U.S. Pat. No. 4,160,991 entitled "High Performance Bipolar Device and Method for Making Same" granted July 10, 1979 to N. G. Anantha et al. The Anantha et al patent discloses a method for manufacturing a high performance bipolar device and the resulting structure which has a very small emitter-base spacing. The small emitter-base spacing reduces the base resistance compared to earlier device spacing and thereby improves the performance of the bipolar device. The method involves providing a silicon semiconductor body having regions of monocrystalline silicon isolated from one another by isolation regions and a buried subcollector therein. A base region is formed in the isolated monocrystalline silicon. A mask is formed on the surface of the silicon body covering those regions designated to be the emitter and collector reach-through regions. A doped polycrystalline silicon layer is then formed through the mask covering the base region and making ohmic contact thereto. An insulating layer is formed over the polysilicon layer. The mask is removed from those regions designated to be the emitter and collector reach-through regions. The emitter junction is then formed in the base region and the collector reach-through formed to contact the buried subcollector. Electrical contacts are made to the emitter and collector. The doped polycrystalline silicon layer is the electrical contact to the base regions.

The present trend in semiconductor technology is toward large scale integration of devices with very high speed and low power dissipation. To achieve this goal, it is essential that the devices be made as small as possible and that the parasitic capacitance be reduced to a small value. These high performance devices can be made by (a) making the vertical junction structure shallow, (b) reducing the horizontal geometry and (c) achieving complete dielectric isolation.

Shallow-junction device profile can be achieved with ion-implantation of dopant species. Ion-implantation technique permits precise control of the impurity dose and depth of penetration into the semiconductor. Unlike the conventional thermal diffusion process, ion-implantation is not a high temperature process. Thus, by using lithographic resist or metal maskings, multiple impurity introduction operations can be achieved without resort to high temperatures. Exposure to high temperature, as in a diffusion process, disperses the impurities previously introduced. For the implanted device, a designed thermal cycle is used to activate and diffuse the various dopant species to the desired junction depth and profile.

Device horizontal geometry depends to a large extent on the lithographic tools available. Within a given constraint, however, the use of a self-aligned process can greatly reduce the device horizontal dimension. By implementation of the dielectric isolation scheme such as Recessed Oxide Isolation (ROI) or Deep Dielectric Isolation (DDI) the successive fabrication steps can be done in a self-alignment fashion. In addition to reduction of device horizontal geometry, dielectric isolation also eliminates the sidewalls of the device doping regions and thus further reduces the device parasitic capacitances. The problem associated with the ROI is the formation of "bird's beak" and "bird's head" structure at the lateral edges of the recessed oxide. The 'bird's beak' structure prevents the device junction sidewalls to fully butt against the dielectric isolation and thus imposes the need for wider tolerance of device lateral dimension. The newly developed deep dielectric isolation, DDI, avoids the above mentioned ROI problem. Unlike the bird's beak structure in ROI, sidewalls of the DDI structure are nearly vertical. Also, the surface of the DDI regions and the silicon where device regions are to be formed is coplanar. [Reference is made to U.S. Pat. No. 4,104,086 entitled "Method For Forming Isolated Regions of Silicon Utilizing Reactive Ion Etching" granted Aug. 1, 1978 to J. A. Bondur et al., and U.S. Pat. No. 4,139,442 entitled "Reactive Ion Etching Method For Producing Deep Dielectric Isolation in Silicon" granted Feb. 13, 1979 to J. A. Bondur et al., respectively of common assignee herewith].

For the very small bipolar transistor, as for example, submicron size transistor, the base area and hence the collector-base junction capacitance is the most significant performance parameter. The active base area in the bipolar transistor is the region below the emitter. The base region which surrounds the emitter is the inactive base. On the conventional transistors, fabricated by the prior art, the metal to base contact is formed directly above the inactive base region. The transistor base area that is needed to accommodate the emitter and base contacts is considerably larger than the active base region.

To reduce the transistor base area, a process using polysilicon for making contact to the base is described in the afore-identified U.S. Pat. No. 4,160,991, issued to N. G. Anantha et al. on July 10, 1979 and of common assignee herewith. The heavily doped polysilicon is used to make contact to the transistor base and the metal to polysilicon contact and hence to the base, is formed outside the base region over the oxide isolation area. The emitter opening process described in the Anantha et al., patent, however, is not a self-aligned process. Therefore, transistor base area of the Anantha et al., device must be large enough to allow polysilicon to make low resistance contact to the base and also provide a sufficient leeway for the misregistration of the emitter contact to the doped region. Since the base area and hence the base-collector junction capacitance is a very important parameter in the performance of a very fast device, it is necessary to reduce this area to the minimum possible value. In accordance with the invention a self-aligned emitter to polysilicon base process is disclosed. The process removes the misregistration problem encountered in the process in accordance with the prior art.

SUMMARY OF THE INVENTION

The bipolar transistor structure, fabricated in accordance with this invention is shown in FIGS. 1A, 1B and 1C. The device region is isolated from the other devices on the wafer by a deep oxide trench. The deep oxide trench which has nearly vertical sidewalls, extends from the epitaxial silicon surface through the N+ subcollector region into the P− substrate. A shallow oxide trench is used to separate the collector reach-through region from the base region. A heavily doped polysilicon layer is used to dope and make contact to the transistor base as well as define the emitter window through which the emitter is doped. The separation of the emitter window and the polysilicon base contact in this device structure is minimized to a very small value achieved by using a self-aligned process scheme. Metal contact to the polysilicon, and hence to the transistor base, is done over the deep trench oxide isolation, thus allowing the transistor base area, and hence the collector-base capacitance, to be minimized. The shallow emitter and narrow base width of the transistor are formed by ion-implantation techniques.

DESCRIPTION OF THE PREFERRED EMBODIMENTS

Figure 2:
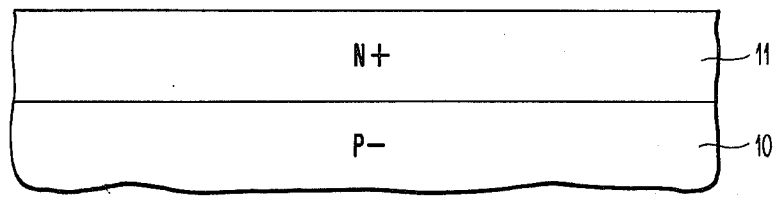
Figure 3:
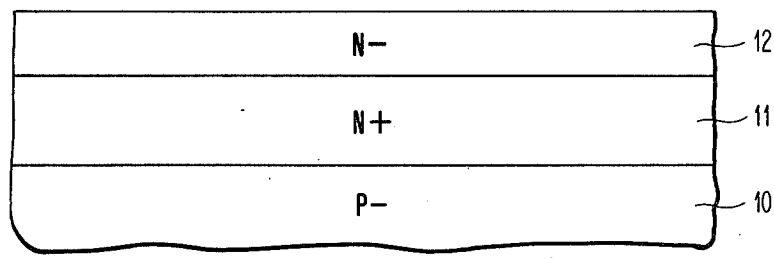

Referring now to the drawings and FIG. 2 in particular, a P-type monocrystalline silicon wafer 10 is the starting substrate. An N-type impurity such as arsenic is introduced into wafer 10 forming the subcollector 11. The introduction of the N-type impurity can be done by, as for example, capsule diffusion or ion implantation. The resistivity of the N+ subcollector 11 is approximately 0.001 ohm-cm, As shown in FIG. 3, an N-type epitaxial silicon layer 12 of approximately 1.0 $\mu$m to 1.5 $\mu$m thick is deposited on the subcollector surface of 11. The resistivity of the epitaxial layer 12 is about 0.3 ohm-cm.

Figure 4:
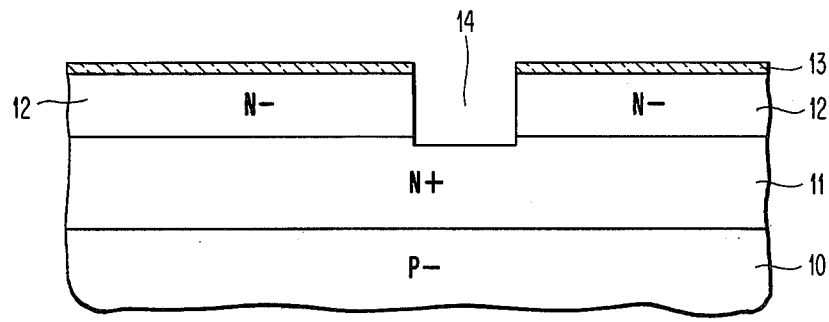

As shown in FIG. 4, an oxide layer 13, approximately 3,000 Å thick, preferably formed by chemical vapor deposition, CVD, process is deposited on the epitaxial silicon layer 12. A lithographic step is applied to form a resist window (not shown) which overlies the position of the shallow dielectric isolation trench to be fabricated. The exposed oxide layer 13 is then opened by reactive-ion etching RIE. Using the oxide layer 13 as an etch mask, the exposed silicon in region 14 is then etched by a RIE technique. The etching will be stopped when it reaches to the N+ subcollector region 11. The remaining oxide mask layer 13 is then stripped by a chemical solution, for example, buffer-HF solution.

Figure 5:
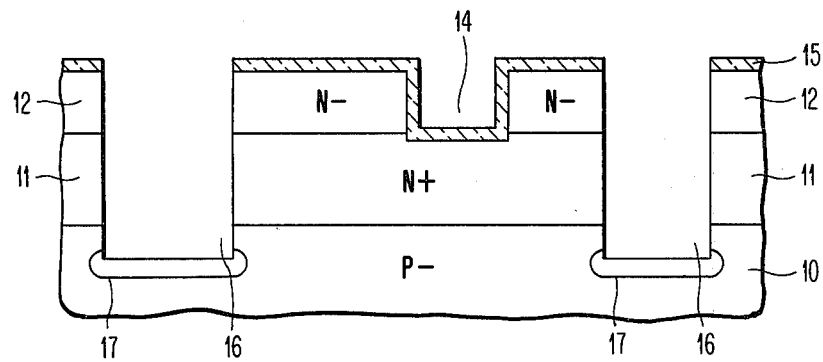

Referring to FIG. 5, a CVD oxide layer 15, approximately 7,000 Å thick is formed over the silicon surface 12. Subsequently, a lithography step is applied to form a resist defined window (not shown) which overlies the position of the deep dielectric isolation trench 16 to be fabricated. The oxide 15 defined by the resist is then opened by RIE. Using the oxide 15 as an etch mask, RIE through the epitaxial silicon layer 12 and subcollector 11 to form the deep trench 16 enclosing the device area. Subsequently, using a thin CVD SiO$_2$ layer (not shown) to protect the sidewalls of the deep trench 16, a shallow boron implantation is made into the bottom of the deep trench to form channel stopper 17.

Figure 6:
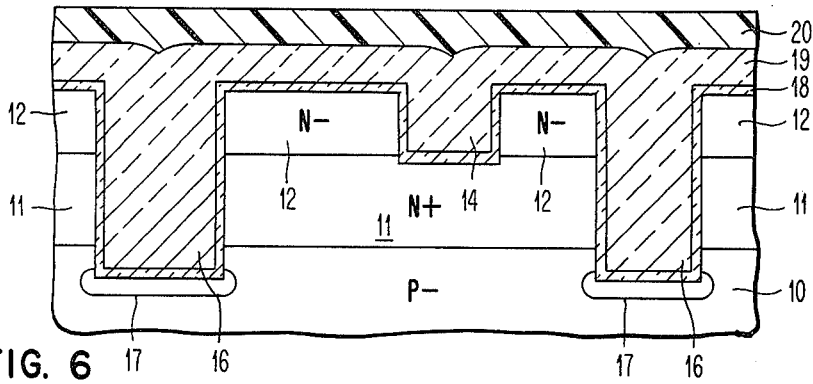

After stripping the CVD oxide masking layer 15, the wafer is thermally oxidized to form a high quality SiO$_2$ layer 18 over the exposed silicon surface. As shown in FIG. 6, a thick oxide layer 19, preferably formed by low pressure CVD, LPCVD, technique, is used to over-fill the shallow trench 14, deep trench 16 and to obtain planarization of the wafer surface. The oxide 19 obtained by LPCVD has an excellent thickness uniformity. A resist layer 20 may be applied over the wafer to improve planarization of the device surface by filling the crevice over the center area of the overfilled trenches.

Figure 7:
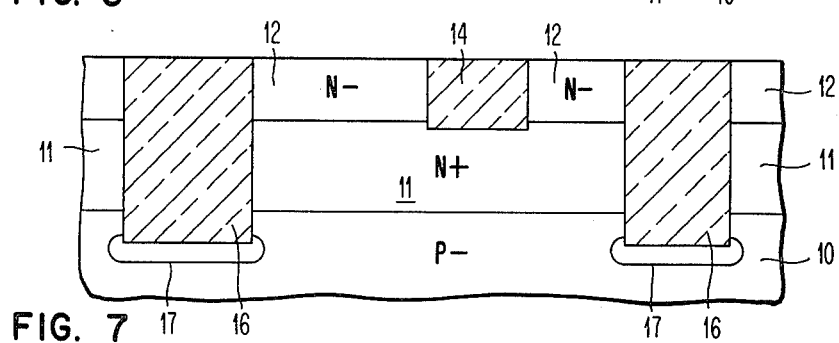

The next process step is to use RIE technique to etch back the resist layer 20 and the oxide layer 19. Of primary importance is that the RIE etch rate for resist is nearly equal to that of SiO$_2$. Thus, with a planarized resist and oxide composite layer everywhere over the wafer, a back-etching to the silicon will yield a planar surface with filled-in deep oxide trench 16 and shallow oxide trench 14 as shown in FIG. 7.

Figure 8:
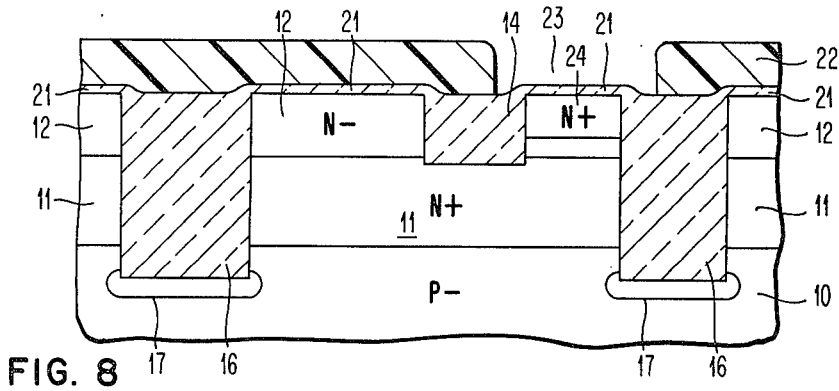

Referring now to FIG. 8, an SiO$_2$ layer 21 of approximately 500 Å thick is thermally grown on the epitaxial silicon surface 12. A resist layer 22 is deposited, exposed and developed to form a block-out window 23 which overlies the subcollector reach-through region 24 to be fabricated. A suitable N-type impurity, preferably phosphorus, is ion-implanted through oxide layer 21 to form an N+ reach-through region 24. The masking resist layer 22 is then stripped.

Figure 9:
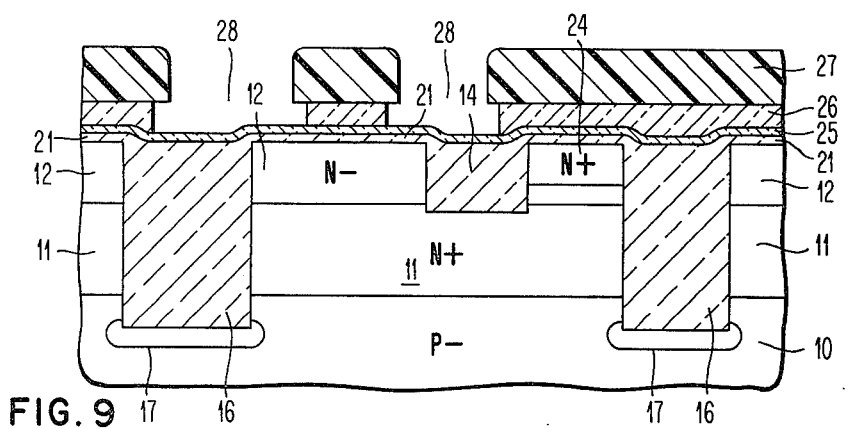

As shown in FIG. 9, a CVD Si$_3$N$_4$ layer 25, approximately 500 Å thick is deposited over the SiO$_2$ layer 21. A CVD oxide layer 26 is subsequently formed over the Si$_3$N$_4$ layer 25 surface. The thickness of the deposited oxide layer 26 is about 3000 Å. As illustrated in FIG. 9, a resist pattern 27, which defines the polysilicon base contact region 28 is formed. Using the resist layer 27 as an etch mask, the CVD oxide 26 is etched by a RIE technique. The etching is stopped when the underlying Si$_3$N$_4$ layer 25 surface is reached. If Si$_3$N$_4$ is not a good stop for RIE oxide, a thin ($\sim$200 Å) polysilicon layer (not shown) deposited on the Si$_3$N$_4$ may be used to serve as a stopper. The opened oxide window is then etched in the lateral direction by buffer-HF solution to create an oxide undercut of about 0.2–0.3 μm.

The base contact is then opened by a directional RIE to etch through the Si$_3$N$_4$ 25 and SiO$_2$ 21 layers. Etching of the Si$_3$N$_4$ and SiO$_2$ layers in this RIE operation is defined by the resist pattern instead of the undercut oxide 26 opening. Next, the resist pattern 27 is stripped.

[Referring to the structure shown in FIG. 9, it is to be appreciated that P type ions, with a suitable energy, may be implanted therein to provide the doping of the inactive base.]

Figure 10:
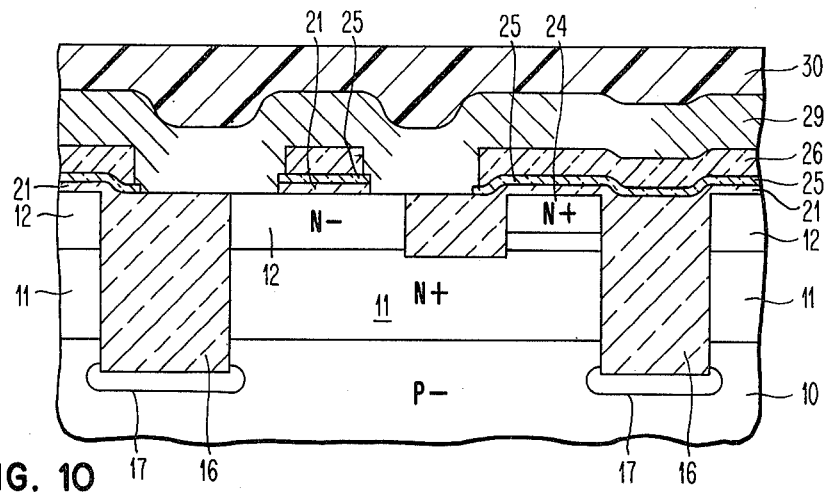

As illustrated in FIG. 10, a heavily doped P-type polysilicon layer 29, about 4500 Å thick, is formed over the wafer surface. The polysilicon 29 is formed, preferably, by a low pressure CVD process which is characterized by good thickness uniformity. Doping of the polysilicon layer 29 can be done insitu during the CVD process. Alternatively, intrinsic polysilicon layer can be deposited and subsequently doped by boron implantation. A blanket resist layer 30 is next deposited and treated appropriately to planarize the polysilicon surface. The subsequent process step is to thin back the resist layer 30 and polysilicon layer 29 by RIE. It is important to have an RIE etch rate for resist equal to that of polysilicon.

Figure 11:
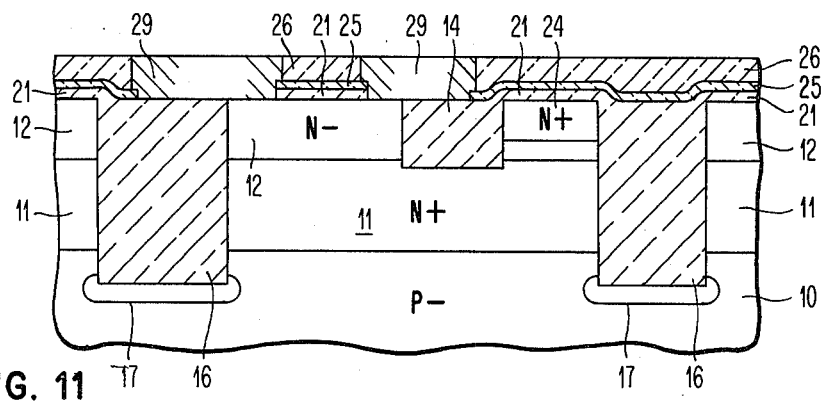

As shown in FIG. 11, RIE will be stopped when the CVD oxide layer 26 is reached. The polysilicon 29 is formed in the base contact opening defined by CVD oxide layer 26.

Figure 12:
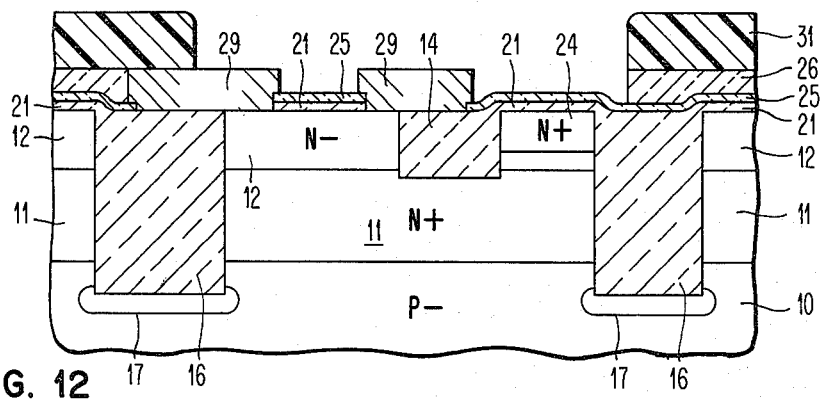

Referring to FIGS. 11 and 12, a resist layer 31 is deposited, exposed and developed to form a block-out mask to define the transistor device region. The exposed CVD oxide 26 is then removed with buffer-HF solution. The etch stop is the underlying Si$_3$N$_4$ layer 25. Subsequently the resist layer 31 is stripped.

Figure 13:
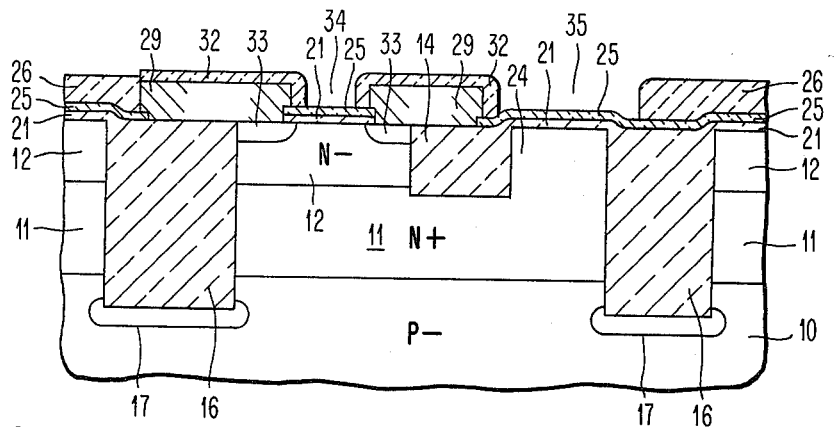

As shown in FIG. 13, a thermal oxidation is then performed to grow a relatively thick SiO$_2$ layer 32 over the exposed polysilicon 29 surface. The thickness of thermal SiO$_2$ layer 32 is approximately 2500 Å. To minimize the outdiffusion of the boron from polysilicon layer 29 into the underlying epitaxial silicon region 12, the SiO$_2$ layer 32 is preferably formed in a lower temperature-high pressure oxidation. Outdiffusion of the P-type impurity into the epitaxial silicon 12 forms the device inactive base region 33. The Si$_3$N$_4$ layer 25 which overlies the emitter 34 and collector contact 35 regions prevents SiO$_2$ formation in these contact regions. After formation of SiO$_2$ over the polysilicon, the Si$_3$N$_4$ layer 25 on the emitter and collector contacts is removed by using either RIE or warm H$_3$PO$_4$ solution. The SiO$_2$ layer 21 over the emitter 34 and collector 35 contacts are then opened by an RIE technique. The result is shown in FIG. 14.

Figure 14:
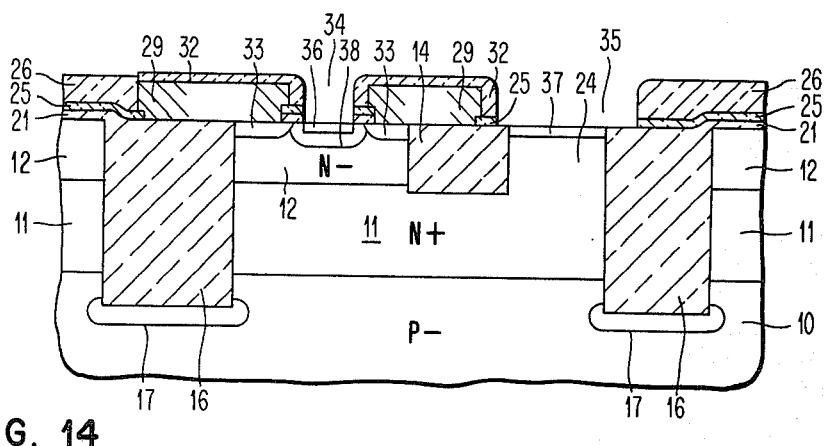

As illustrated in FIG. 14, an N-type impurity, preferably arsenic, is introduced through the emitter contact 34 and the collector contact 35 into the epitaxial silicon 12 to form the emitter region 36 and the collector contact region 37. The N-type impurity is introduced into epitaxial silicon 12 by using a low energy arsenic ion-implantation. Next, a low dose, e.g., $\sim 1 \times 10^{13}$ atoms/cm$^2$ boron implantation is made into the epitaxial silicon 12 to form the active base doping region 38.

Figure 15:
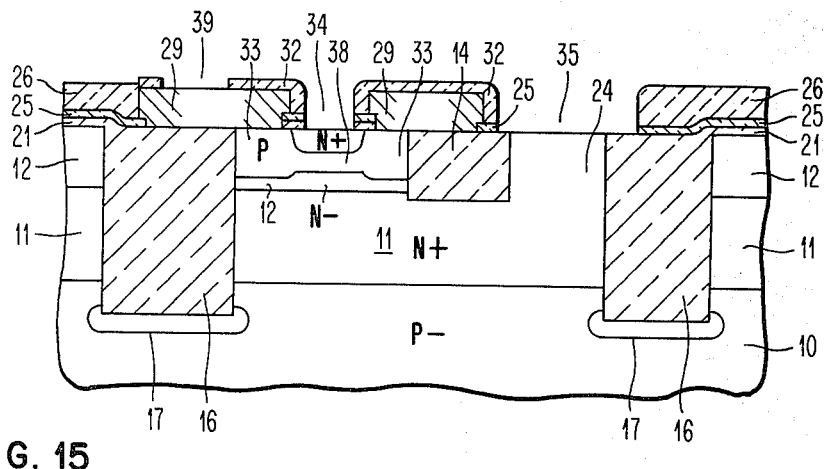

Referring now to FIG. 15, the device is given a final thermal drive-in diffusion process which would anneal out the radiation damage caused by ion-implantations. The drive-in diffusion also forms the device with desired junction depths. Simultaneously, the boron in the heavily-doped polysilicon 29 will outdiffuse to form the inactive base 33. For fabrication of very shallow bipolar transistor, as for example, emitter depth=0.1 μm and base width×0.1 μm, shallow device structure, the drive-in annealing temperature is around 900° to 950° C. The annealing is done in a nitrogen ambient. Next, a contact 39 to the polysilicon is opened by lithography and etching.

As shown in FIG. 15, the contact to the polysilicon is formed at the region outside the transistor base 33 over the deep oxide isolation trench 16. The device is now ready for deposition and fabrication of the metallurgy which will interconnect the device with other devices on the wafer. The forming of the metallurgy system is well known in the art and will not be described.

While the invention has been particularly shown and described with reference to the preferred embodiment thereof, it will be understood by those skilled in the art that various changes in form and detail may be made therein without departing from the spirit and scope of the invention.

I claim:

1. In a method for fabricating a bipolar transistor structure in a silicon substrate of a first conductivity type, said substrate having a planar surface, a subcollector region of opposite conductivity type disposed therein, a layer of opposite conductivity type epitaxial material on said planar surface, first and second spaced apart adjacent isolated regions, said first isolated region being provided for the to be formed emitter/base region of said bipolar transistor structure and said second isolated region being provided for the to be formed collector reach through region of said bipolar transistor structure, said method comprising the following steps:
 (a) form a first oxide layer and a silicon nitride layer, in the order recited, on said epitaxial layer;
 (b) form a relatively thick oxide layer over said silicon nitride layer;
 (c) utilizing photolithographic techniques open two spaced apart windows in a photoresist mask to expose areas of the relatively thick oxide layer;
 (d) utilizing the photoresist mask etch and undercut the exposed relatively thick oxide layer to expose the corresponding areas of the silicon nitride; (emitter mask partially formed);
 (e) utilizing the photoresist mask reactive ion etch the exposed silicon nitride layer and the first oxide layer to the epitaxial layer;
 (f) ion implant ions of the first conductivity type to dope an inactive base;
 (g) strip photoresist;
 (h) form a relatively thick layer of first conductivity type doped polysilicon on the exposed surface of the substrate;
 (i) utilizing known photolithographic techniques, including the deposition of a photoresist layer, planarize the exposed surface of the substrate;
 (j) utilize reactive ion etch techniques to etch photoresist and polysilicon to surface level of said relatively thick oxide layer;
 (k) remove remaining portions of relatively thick oxide layer overlying said first and second isolated regions;
 (l) form an oxide layer on the exposed surface of said polysilicon layer;
 (m) utilizing known photolithographic techniques form a block-out mask for use in opening emitter and collector contacts;
 (n) utilizing reactive ion etch techniques remove exposed areas of silicon nitride and underlying areas of first oxide layer;
 (o) ion implant ions of the second conductivity type into emitter and collector regions;
 (p) ion implant ions of the first conductivity type into an active base region; and
 (q) utilizing known techniques complete the following:
   (1) ion implant collector reach-through region,
   (2) emitter drive-in to activate all implanted dopants,
   (3) open base contact to polysilicon, and
   (4) provide first level metallurgy.

2. In a method of fabricating a bipolar transistor structure in a silicon substrate of a first conductivity type, said substrate having a planar surface, a subcollector region of second conductivity type disposed therein, a layer of second conductivity type epitaxial material on said planar surface, first and second spaced apart adjacent isolated regions, said first isolated region being provided for the to be formed emitter/base region of said bipolar transistor structure and said second isolated region being provided for the to be formed collector reach through region of said bipolar transistor structure, said method comprising the following steps:
 (a) form a first oxide layer and a silicon nitride layer, in the order recited, on said epitaxial layer;
 (b) form a relatively thick oxide layer over said silicon nitride layer;
 (c) utilizing photolithographic techniques open two spaced apart windows in the photoresist to expose areas of the relatively thick oxide layer;
 (d) etch and undercut the exposed relatively thick oxide layer to expose the corresponding areas of the silicon nitride layer;
 (e) utilizing the photoresist mask reactive ion etch the exposed silicon nitride layer and the first oxide layer to the epitaxial layer;
 (f) strip photoresist;
 (g) form relatively thick layer of first conductivity type doped polysilicon on exposed surface of substrate;
 (h) utilizing known photolithographic techniques, including the deposition of a photoresist layer, planarize exposed surface of substrate;
 (i) utilize reactive ion etching to etch photoresist and polysilicon to level of relatively thick oxide layer;
 (j) remove remaining relatively thick oxide layer overlying said first and second isolated regions;
 (k) form oxide layer on exposed surface of polysilicon layer;
 (l) utilizing known photolighographic techniques form block-out mask for opening emitter and collector contacts;
 (m) utilizing reactive ion etch techniques remove exposed areas of silicon nitride and underlying areas of first oxide layer;
 (n) ion implant ions of the second conductivity type into emitter and collector regions; and
 (o) ion implant ions of the first conductivity type into active base region.

Figure 1A:
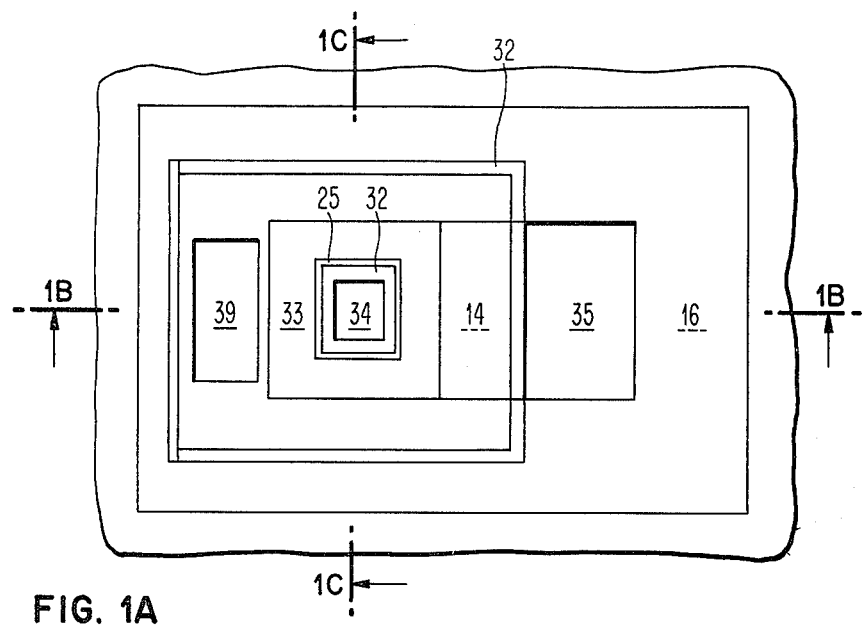
Figure 1B:
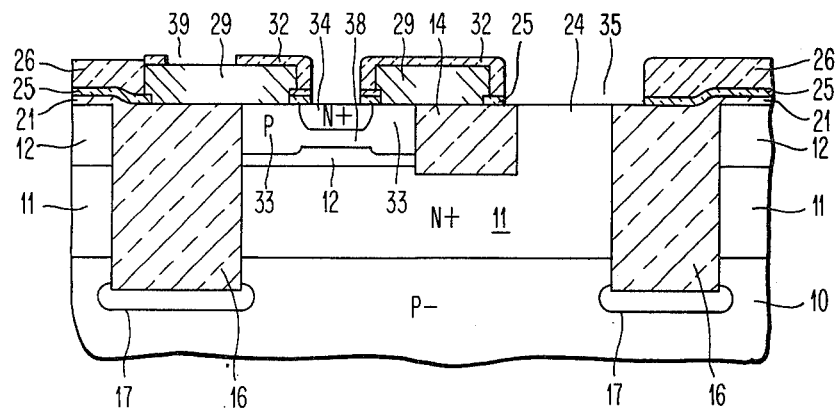
Figure 1C:
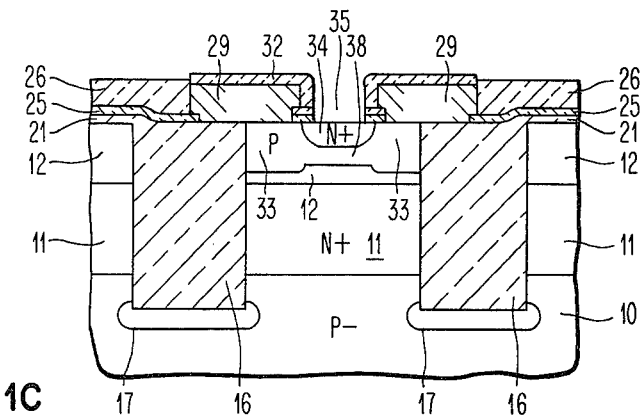

3. In a process for fabricating an improved bipolar transistor (FIGS. 1A, 1B, 1C) in a silicon substrate of a first conductivity type, said substrate having a planar surface, a subcollector region of a second conductivity type formed in said substrate, an epitaxial layer of said second conductivity type formed on said planar surface of said substrate, first and second spaced apart adjacent isolated regions, said first isolated region being provided for the to be formed emitter/base region of said bipolar transistor and said second isolated region being provided for the to be formed collector reach through region of said bipolar transistor, said process including the following steps:
 (a) form a first relatively thin oxide layer (21, FIG. 8) on said epitaxial layer (12);
 (b) utilizing a suitable block-out mask (22, FIG. 8), ion implant impurities of a second conductivity type into the epitaxial surface of said second isolated region thereby forming a collector reach through region (24);
 (c) form a first relatively thin silicon nitride layer (25, FIG. 9) on said first oxide layer;
 (d) form a second relatively thick oxide layer (26, FIG. 9) on said first silicon nitride layer;
 (e) form a resist mask having first and second spaced apart windows (28, FIG. 9) said windows respectively exposing discrete regions of said second relatively thick oxide layer, said first window extending over a portion of said first isolated region, said second window extending over a portion of said first isolated region;

(f) utilizing reactive-ion etch techniques and said first and second spaced apart windows of said mask formed in step (e) remove the exposed regions of said second relatively thick oxide layer to provide first and second spaced apart openings in said relatively thick oxide layer, said openings in said second relatively thick oxide layer respectively corresponding in area to the area of said first and second windows in said mask formed in step (e);

(g) utilizing said mask formed in step (e) and a liquid etchant enlarge said first and second spaced apart openings in said relatively thick oxide layer;

(h) utilizing reactive ion etch techniques and said first and second spaced apart windows of said mask formed in step (e) provide first and second spaced apart openings in said first silicon nitride layer and the underlying first oxide layer, said first and second spaced apart openings in said first silicon nitride layer and said underlying first oxide layer respectively corresponding in area to the area of said first and second spaced apart windows in said mask formed in step (e);

(i) remove said mask formed in step (e);

(j) chemically vapor deposit a relatively thick polysilicon layer of said first conductivity type (29, FIG. 10) on the exposed surface of said substrate;

(k) utilizing a layer of photoresist (30, FIG. 10) planarize the exposed surface of the substrate;

(l) utilizing reactive ion etch techniques etch back said photoresist and polysilicon to stop at the surface of said second relatively thick oxide layer (26, FIG. 11);

(m) form a mask (31, FIG. 12) having a window which exposes the transistor region, the transistor region including said first and second isolated regions;

(n) remove the exposed portions of said second relatively thick oxide layer (26, FIG. 12);

(o) form a relatively thick oxide layer (32, FIG. 13) over said polysilicon layer;

(p) remove the exposed portions of said first silicon nitride layer (FIG. 14);

(q) remove the exposed portions of said first silicon oxide layer (FIG. 14) to open emitter and collector contact openings;

(r) via said emitter and collector contact openings implant ions of said second conductivity type to form an emitter region (36, FIG. 14) and a collector contact region (37, FIG. 14); and (s) via said emitter contact opening implant ions of said first conductivity type to form an intrinsic base region (38, FIG. 15).

4. In a process for fabricating an improved bipolar transistor (FIGS. 1A, 1B, 1C) in a silicon substrate of a first conductivity type, as recited in claim 3, wherein subsequent to step (s) a base contact opening (39, FIG. 15) is opened in said oxide layer 32, to expose a portion of said relatively thick polysilicon layer 29, of first conductivity type.

5. In a process for fabricating an improved bipolar transistor (FIGS. 1A, 1B, 1C) in a silicon substrate of a first conductivity type, as recited in claim 3, wherein in step (j) said relatively thick chemically vapor deposited polysilicon layer (29, FIG. 10) is undoped, and subsequent to step (j) and prior to step (k) said relatively thick polysilicon layer is ion implanted with ions of said first conductivity type.

6. In a process for fabricating an improved bipolar transistor in a silicon substrate of a first conductivity type, said substrate having a planar surface, a subcollector region of a second conductivity type formed in said substrate, an epitaxial layer of said second conductivity type formed on said planar surface of said substrate, first and second spaced apart adjacent isolated regions, said first isolated region being provided for the to be formed emitter/base region of said bipolar transistor and said second isolated region being provided for the to be formed collector reach through region of said bipolar transistor, said process including the following steps:

(a) form a first relatively thin oxide layer on said epitaxial layer;

(b) utilizing a block-out mask, implant ions of said second conductivity type into the epitaxial surface of said second isolated region to thereby form a collector reach through region;

(c) form a first relatively thin silicon nitride layer on said first oxide layer;

(d) form a second relatively thick oxide layer on said first silicon nitride layer;

(e) form a resist mask having first and second spaced apart windows, said windows respectively exposing discrete regions of said second relatively thick oxide layer, said first window extending over a portion of said first isolated region, said second window extending over a portion of said first isolated region;

(f) utilizing reactive-ion etching and said first and second spaced apart windows of said mask formed in step (e) remove the exposed portions of said second relatively thick oxide layer to provide first and second spaced apart openings in said relatively thick oxide layer, said openings in said second relatively thick oxide layer respectively corresponding in area to the area of said first and second windows in said mask formed in step (e);

(g) utilizing said mask formed in step (e) and a liquid etchant to enlarge said first and second openings in said relatively thick oxide layer;

(h) utilize reactive ion etching and said first and second spaced apart windows of said mask formed in step (e) to provide first and second spaced apart openings in said first silicon nitride layer and the underlying first oxide layer, said first and second spaced apart openings in said first silicon nitride layer and said underlying first oxide layer respectively corresponding in area to the area of said first and second spaced apart windows in said mask formed in step (e);

(i) remove said mask formed in step (e);

(j) chemically vapor deposit a relatively thick polysilicon layer of said first conductivity type on the exposed surface of said substrate;

(k) utilize a layer of photoresist to planarize the exposed surface of said substrate;

(l) utilize reactive ion etching to etch back said photoresist and polysilicon to stop at the surface of said second relatively thick oxide layer;

(m) form a photoresist mask having a window which extends over said first and second isolated regions, said window exposing the transistor region;

(n) remove the exposed portions of said second relatively thick oxide layer;

(o) form a relatively thick oxide layer over said polysilicon layer;

(p) remove the exposed portions of said first silicon nitride layer; and (q) remove the exposed portions of said first silicon oxide layer to open emitter and collector contact openings.

7. In a process for fabricating an improved bipolar transistor in a silicon substrate of a first conductivity type, as recited in claim 6, wherein said first relatively thin oxide layer has a thickness of approximately 500 Å, said first relatively thin silicon nitride layer has a thickness of approximately 500 Å, and said second relatively thick oxide layer has a thickness of approximately 3000 Å.

* * * * *